United States Patent
Chin et al.

(10) Patent No.: US 6,529,356 B2
(45) Date of Patent: Mar. 4, 2003

(54) POWER POLARITY REVERSAL PROTECTING CIRCUIT FOR AN INTEGRATED CIRCUIT

(75) Inventors: Hsu-Yuan Chin, Hsinchu (TW); Wen-Chi Lin, Nantou (TW)

(73) Assignee: Silicon Touch Technology Inc., Hsinchu (TW)

(*) Notice: Subject to any disclaimer, the term of this patent is extended or adjusted under 35 U.S.C. 154(b) by 265 days.

(21) Appl. No.: 09/754,304

(22) Filed: Jan. 5, 2001

(65) Prior Publication Data

US 2002/0089803 A1 Jul. 11, 2002

(51) Int. Cl.[7] .................................................. H02H 3/18
(52) U.S. Cl. .............................. 361/84; 361/86; 361/56; 307/127
(58) Field of Search .............................. 361/84, 86, 56; 307/127; 257/355

(56) References Cited

U.S. PATENT DOCUMENTS

| | | | | |
|---|---|---|---|---|
| 5,126,911 A | * | 6/1992 | Contiero et al. | ............... 361/84 |
| 5,504,361 A | * | 4/1996 | Blossfeld | ..................... 257/355 |
| 5,648,739 A | * | 7/1997 | Walther et al. | ............. 327/330 |
| 6,304,422 B1 | * | 10/2001 | Sander et al. | ................... 361/84 |
| 6,413,806 B1 | * | 7/2002 | Sicard et al. | ............... 438/197 |

* cited by examiner

Primary Examiner—Kim Huynh
(74) Attorney, Agent, or Firm—Bacon & Thomas, PLLC

(57) ABSTRACT

A power polarity reversal protecting circuit for an integrated circuit includes a protecting transistor, PMOS components and NMOS components, wherein the protecting transistor is a protecting PMOS transistor or a protecting NMOS transistor. If the protecting transistor is the PMOS transistor, a gate and a source of the protecting PMOS transistor are respectively connected to ground and power. A drain and a substrate of the protecting PMOS transistor is connected to a substrate of the PMOS component. If the protecting transistor is the protecting NMOS transistor, a gate and a source of the protecting NMOS transistor are respectively connected to power and ground. A drain and a substrate of the protecting NMOS transistor is connected to a substrate of the NMOS component. When the power polarity is in reversal connection, the protecting transistors are terminated to prevent damage from the power polarity reversal connection.

4 Claims, 2 Drawing Sheets

POWER POLARITY REVERSAL PROTECTING CIRCUIT FOR AN INTEGRATED CIRCUIT

BACKGROUND OF THE INVENTION

1. Field of the Invention

The present invention relates to a power polarity reversal protecting circuit, and more particularly to a protecting circuit which provides a protection to components in an integrated circuit so as to avoid damage caused by power polarity reversal.

2. Description of the Related Art

A requirement of requirement of protection from power polarity reversal connection is necessary in a driving circuit of a brushless cooling fan or a battery supplied electronic system. When a power polarity is reversed, a large current is passing through the integrated circuit and hence components in the integrated circuit are burned out. In order to avoid the aforementioned problems, many power polarity reversal protecting means are provided.

With reference to FIG. 3, an integrated circuit, such as an inverter, without any power polarity reversal protecting means is shown. The inverter includes a p-channel metal-oxide-semiconductor (PMOS) transistor (30), an n-channel metal-oxide-semiconductor (NMOS) transistor (31) and two parasitic diodes D1 and D2, wherein a connection on the PMOS transistor (30) and the NMOS transistor (31) is a known technology so it is not be discussed. The parasitic diode D1 has a cathode connected to a substrate of the PMOS transistor (30) and power VDD, and an anode is connected to an output of the inverter. The parasitic diode D2 has a cathode connected to the output of the inverter, and an anode is connected to a substrate of the NMOS transistor (30) and ground GND.

When the power polarity is correctly connected to the inverter, the inverter operates normally and the two parasitic diodes D1, D2 are both reversal biased between power VDD and ground GND. Once the power polarity is in reversal connection, it means that power VDD reverses to ground GND and ground GND reverses to power VDD, and the two parasitic diodes D1, D2 both become forward biased so that the large current is generated. The large current passes through the two parasitic diodes D1, D2 to make the components in the inverter ultimately burn out.

With reference to FIG. 4, in order to avoid damage caused by power polarity reversal, a protecting diode (40) is connected between the power VDD and the inverter. An anode of the protecting diode (40) is connected to the power VDD, and a cathode of the protecting diode (40) is connected to the inverter.

When the power polarity is correctly connected to the inverter, the protecting diode (40) is forward biased and the inverter operates normally. Once the power polarity is in reversal connection, the protecting diode (40) immediately becomes reversal biased and a conducting path through the two parasitic diodes D1, D2 is cut off so as to prevent the damage otherwise caused by power reversal connection. However, when the protecting diode (40) is forward biased, a constant voltage drop is generated across the protecting diode (40) and hence more power is dissipated. Furthermore, the protecting diode (40) is not set originally in the integrated circuit so an extra consumption of buying the protecting diode (40) is needed and hence the cost of the integrated circuit is raised.

To overcome the shortcomings, the present invention tends to provide a power polarity reversal protecting circuit for an integrated circuit to mitigate and obviate the aforementioned problems.

SUMMARY OF THE INVENTION

The main objects of the invention tends to provide a power polarity reversal protecting circuit for an integrated circuit so as to prevent damage caused by power polarity reversal connection.

Other objects advantages and novel features of the invention will become more apparent from the following detailed description when taken in conjunction with the accompanying drawings.

DETAILED DESCRIPTION OF THE PREFERRED EMBODIMENT

Figure 1:
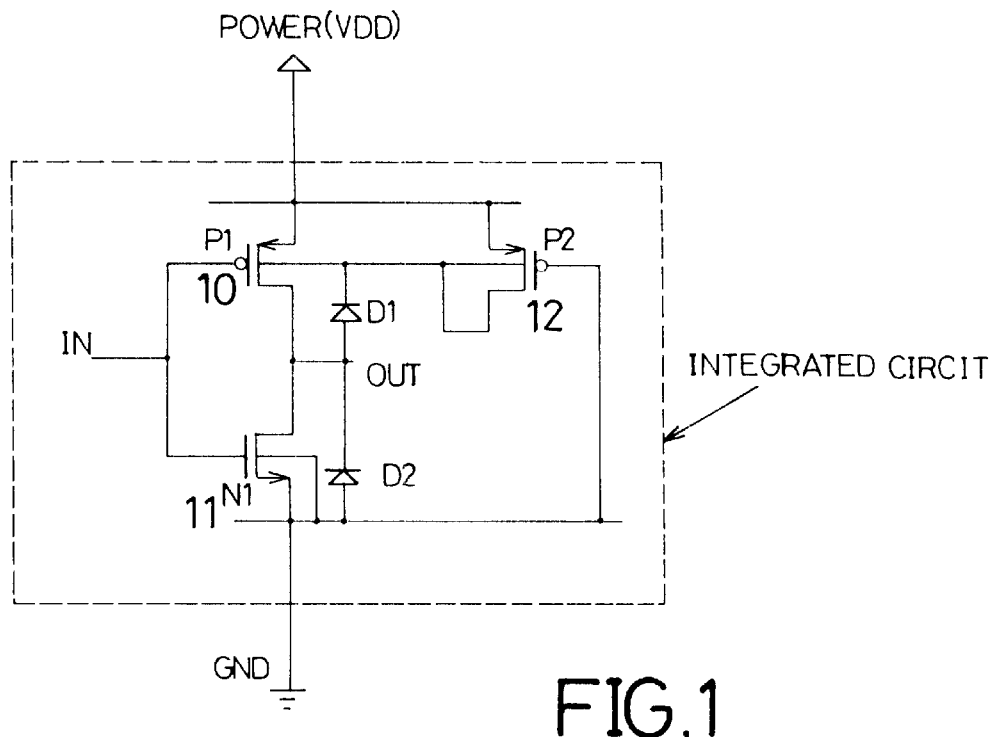
FIG. 1 is a circuit diagram showing that a first embodiment of a power polarity reversal circuit in accordance with the present invention is applied to a CMOS integrated circuit.

With reference to FIG. 1, a first preferred embodiment of a power polarity reversal protecting circuit is applied to an integrated circuit, such as a complementary metal-oxide-semiconductor (CMOS) inverter. The CMOS inverter comprises a p-channel metal-oxide-semiconductor (PMOS) transistor (10), an n-channel metal-oxide-semiconductor (NMOS) transistor (11), a protecting PMOS transistor (12), and two parasitic diodes D1 and D2. The PMOS transistor (10) and the NMOS transistor (11) are connected to form the inverter. The parasitic diode D1 has a cathode connected to a substrate of the PMOS transistor (10), and an anode is connected to an output of the inverter. The parasitic diode D2 has a cathode connected to the output of the inverter, and an anode is connected to ground GND. A source of the protecting PMOS transistor (12) is connected to a source of the PMOS transistor (10) and power VDD. A gate of the protecting PMOS transistor (12) is connected to ground GND. A substrate and a drain of the protecting PMOS transistor (12) are connected to the cathode of the parasitic diode D1 and the substrate of the PMOS transistor (10).

When the power polarity is correctly connected to the inverter, the protecting PMOS transistor (12) is in conducting status and the two parasitic diodes D1, D2 are both reversal biased and hence the inverter operates normally. Once the power polarity is in reversal connection, the gate of the protecting PMOS transistor (12) becomes connected to power VDD and causes the protecting PMOS transistor (12) to be terminated. Because the protecting PMOS transistor (12) is disabled, a conduction path of the two parasitic diodes D1, D2 is blocked by the protecting PMOS transistor (12) so as to prevent damage caused by power polarity reversal connection.

Figure 2:
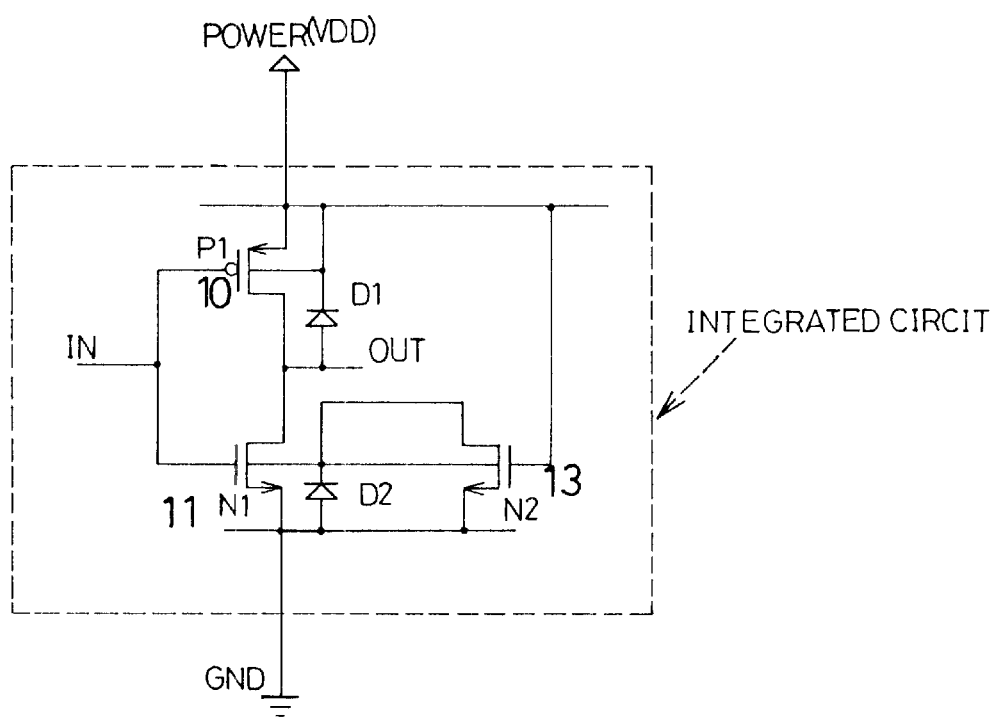
FIG. 2 is a circuit diagram showing that a second embodiment of a power polarity reversal circuit in accordance with the present invention is applied to the CMOS integrated circuit.
Figure 3:
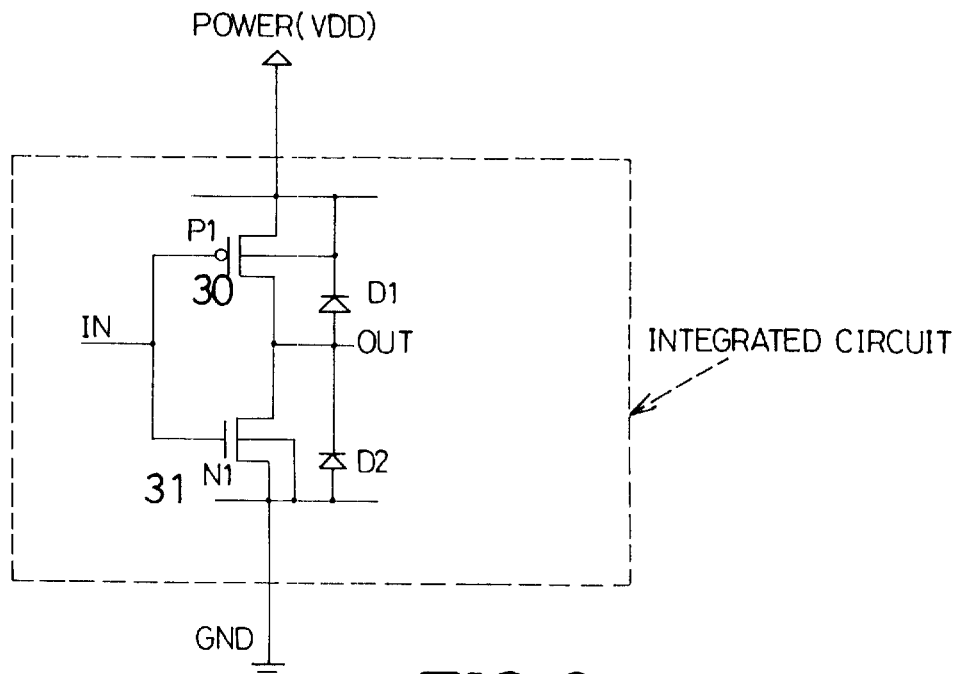
FIG. 3 is a circuit diagram of a conventional inverter without a power polarity reversal circuit.
Figure 4:
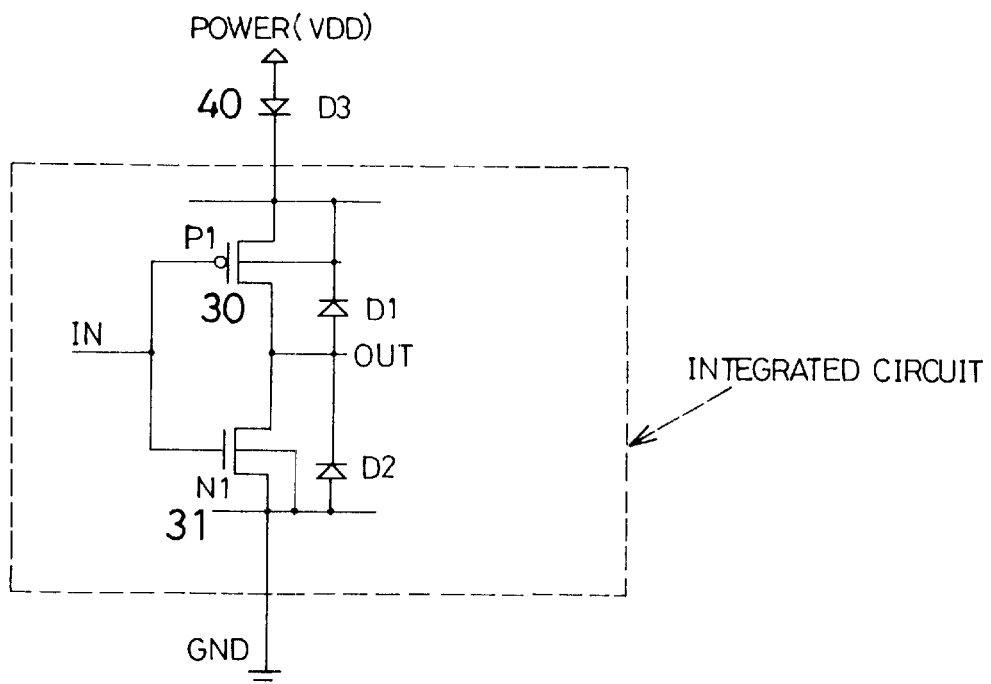
FIG. 4 is a circuit diagram showing that a protecting diode is applied to the conventional inverter showing in FIG. 3.

With reference to FIG. 2, a second preferred embodiment of the power polarity reversal protecting circuit is applied to the integrated circuit, such as the inverter, wherein the protecting PMOS transistor (12) shown in FIG. 1 is replaced with a protecting NMOS transistor (13). The cathode of the parasitic diode D1 is connected to power VDD and the substrate of the PMOS transistor (10). The anode of the parasitic diode D1 is connected to the output of the inverter. The cathode of the parasitic diode D2 is connected to the substrate of the NMOS transistor (11), and the anode is connected to ground GND. A drain and a substrate of the NMOS transistor (13) are connected to the cathode of the parasitic diode D2. A gate of the NMOS transistor (13) is connected to power VDD. A source of the NMOS transistor (13) is connected to ground GND.

When the proper polarity is correctly connected to the inverter, the protecting NMOS transistor (13) is in a conducting status and the two parasitic diodes D1, D2 are both reversal biased and hence the inverter operates normally. Once the power polarity is in reversal connection, the gate of the protecting NMOS transistor (13) becomes connected to ground GND and causes the protecting NMOS transistor (13) to be terminated. Because the protecting NMOS transistor (13) is disabled, a conduction path of the two parasitic diodes D1, D2 is blocked by the protecting NMOS transistor (13) so as to prevent damage caused by power polarity reversal connection.

The power polarity reversal protecting circuit for an integrated circuit has the following advantages:

1. The protecting transistors are simultaneously fabricated in the integrated circuits to protect other components in the integrated circuits, hence no extra protecting components are needed so that the cost of the integrated circuit is low.
2. When the protecting transistors are in a conducting status, a bias current of the protecting transistors is very small, whereby almost no power dissipation occurs and there is no voltage drop on the protecting transistors, even in a high power system.
3. The power polarity reversal protecting circuit is suitable for applying to any kind of analog circuits, very large scale integrated circuits (VLSI) and digital circuits, such as NAND gate, NOR gate, inverter and flip flop etc.

Although the present invention has been explained in relation to its preferred embodiment, it is to be understood that many other possible modifications and variations can be made without departing from the spirit and scope of the invention as hereinafter claimed.

What is claimed is:

1. A power reversal protecting circuit comprising:

a PMOS component having a source and a substrate, wherein the source of the PMOS component is adapted to connect to a power supply; and a protecting PMOS transistor, wherein a gate of the protecting PMOS transistor is adapted to connect to ground, a source of the protecting PMOS transistor is adapted to connect to the power supply, and a drain and a substrate of the protecting PMOS transistor are connected to the substrate of the PMOS component, wherein when the power supply is in reversal connection, the protecting PMOS transistor is terminated to prevent damage caused by the power reversal connection.

2. The power reversal protecting circuit as claimed in claim 1, wherein the PMOS component and the protecting PMOS transistor are fabricated as an integrated circuit.

3. A power reversal protecting circuit comprising:

an NMOS component having a source and a substrate, wherein the source of the NMOS component is adapted to connect to ground; and a protecting NMOS transistor, wherein a gate of the protecting NMOS transistor is adapted to connect to a power supply, a source of the protecting NMOS transistor is adapted to connect to ground, and a drain and a substrate of the protecting NMOS transistor are connected to a substrate of the NMOS component, wherein when the power supply is in reversal connection, the protecting NMOS transistor is terminated to prevent damage caused by the power reversal connection.

4. The power reversal protecting circuit as claimed in claim 3, wherein the NMOS component and the protecting NMOS transistor are fabricated as an integrated circuit.

* * * * *